(12) United States Patent
Kamo et al.

(10) Patent No.: US 7,791,369 B2
(45) Date of Patent: Sep. 7, 2010

(54) SEMICONDUCTOR INTEGRATED CIRCUIT AND OPERATION METHOD OF THE SAME

(75) Inventors: Atsushi Kamo, Kanagawa (JP); Makoto Utsuki, Kanagawa (JP)

(73) Assignee: Sony Corporation, Tokyo (JP)

( * ) Notice: Subject to any disclaimer, the term of this patent is extended or adjusted under 35 U.S.C. 154(b) by 58 days.

(21) Appl. No.: 12/073,729

(22) Filed: Mar. 10, 2008

(65) Prior Publication Data

US 2008/0278194 A1 Nov. 13, 2008

(30) Foreign Application Priority Data

May 11, 2007 (JP) ............................. 2007-126865

(51) Int. Cl.
*H03K 17/16* (2006.01)
*H03K 19/003* (2006.01)

(52) U.S. Cl. .......................................... 326/33; 326/34

(58) Field of Classification Search .................... 326/31, 326/33–34
See application file for complete search history.

(56) References Cited

U.S. PATENT DOCUMENTS

| | | | | |
|---|---|---|---|---|
| 5,583,457 | A * | 12/1996 | Horiguchi et al. ............ | 326/121 |
| 5,614,847 | A * | 3/1997 | Kawahara et al. ............ | 326/98 |
| 5,751,651 | A * | 5/1998 | Ooishi ........................ | 365/226 |
| 6,169,419 | B1 * | 1/2001 | De et al. ..................... | 326/58 |
| 6,307,234 | B1 * | 10/2001 | Ito et al. ...................... | 257/371 |
| 6,310,487 | B1 * | 10/2001 | Yokomizo .................... | 324/769 |
| 6,384,674 | B2 * | 5/2002 | Tanizaki et al. ............. | 327/544 |
| 6,515,513 | B2 * | 2/2003 | Ye et al. ...................... | 326/83 |
| 7,042,245 | B2 * | 5/2006 | Hidaka ........................ | 326/34 |
| 7,126,861 | B2 * | 10/2006 | Hose et al. ............. | 365/189.09 |
| 7,355,455 | B2 * | 4/2008 | Hidaka ........................ | 326/121 |
| 7,447,099 | B2 * | 11/2008 | Ford et al. ................... | 365/226 |
| 2002/0008999 | A1 * | 1/2002 | Hidaka ........................ | 365/200 |

FOREIGN PATENT DOCUMENTS

JP 2005-183681 7/2005

* cited by examiner

*Primary Examiner*—James H. Cho
*Assistant Examiner*—Jason Crawford
(74) *Attorney, Agent, or Firm*—Rader, Fishman & Grauer PLLC

(57) ABSTRACT

A semiconductor integrated circuit including on the same semiconductor substrate: a first circuit block including a switching transistor which is off when the first circuit block is inactive and on when the first circuit block is active, the first circuit block including internal circuits adapted to provide predetermined functions, the internal circuits being connected to a first power line maintained at a low-level source voltage; a second circuit block including internal circuits adapted to provide predetermined functions, the internal circuits being connected to a second power line maintained at a low-level source voltage; a power line switch section connected between the first and second power lines; and a control circuit adapted to control the power line switch section so that the first and second power lines are connected together at a later timing or gradually over a longer period of time than the switching transistor turns on.

12 Claims, 9 Drawing Sheets

SEMICONDUCTOR INTEGRATED CIRCUIT AND OPERATION METHOD OF THE SAME

CROSS REFERENCES TO RELATED APPLICATIONS

The present invention contains subject matter related to Japanese Patent Application JP 2007-126865 filed in the Japan Patent Office on May 11, 2007, the entire contents of which being incorporated herein by reference.

BACKGROUND OF THE INVENTION

1. Field of the Invention

The present invention relates to a semiconductor integrated circuit containing a circuit block (first circuit block) incorporating a technology for reducing power consumption during an inactive period such as so-called MTCMOS and to an operation method of the same for activating the first circuit block.

2. Description of the Related Art

Much headway has been made in reducing the source voltage of CMOS integrated circuits due to increased packaging density and finer patterning achieved in recent years. Source voltage reduction is required not only to ensure reliability as a result of finer patterning but also to reduce power consumption. However, reduced source voltage leads to lower operation speed of MOS transistors. As a result, the CMOS transistor threshold voltage must be lowered to provide improved operation speed and secure a sufficient operational margin. In the case of today's LSIs having a minimum feature size of 100 nm or less, for example, a source voltage Vdd must be reduced to around 1.0 V. In this case, the transistor threshold voltage must be lowered to about 0.3 V.

As is well known, however, increased leak current in the sub-threshold region as a result of the reduction in threshold voltage is problematic. It is therefore essential how to reduce this leak current.

In light of the above, MTCMOS (Multi-threshold Complementary Metal Oxide Semiconductor) has been proposed as a contrivance in circuit configuration in addition to process approaches including improving the leak characteristic and increasing the operational speed, for example, by reducing the parasitic capacitance.

A logic LSI made up of MTCMOSs includes a logic circuit block and switching transistor. The logic circuit block is connected between a virtual source voltage supply line (hereinafter referred to as the "V-Vdd line") and a virtual reference voltage supply line (hereinafter referred to as the "V-Vss line"). The switching transistor is connected between the V-Vdd line and a source voltage supply line (Vdd line) or between the V-Vss line and a reference voltage supply line (Vss line). The switching transistor is on when the logic circuit block is active and off when the logic circuit block is not active. Alternatively, the switching transistor may be provided either between the V-Vdd and Vdd lines or between the V-Vss and Vss lines.

The switching transistor has a higher threshold voltage and handles larger power than the logic transistor of the logic circuit. For this reason, this transistor is also called a power gate transistor.

In the logic circuit block incorporating the MTCMOS technology, a potential difference develops in the virtual power line such as the V-Vdd or V-Vss line according to the operational status of the logic circuit cells making up the logic circuit block. A potential difference changes the delay characteristic of the logic circuits, making it necessary to address this change, for example, by increasing the design margin. This restricts improvement in circuit characteristics.

To overcome this disadvantage, the applicant of the present embodiment applied, for a patent, an embodiment for providing a switching transistor for each logic circuit. The embodiment is disclosed in a Japanese Patent Laid-open No. 2005-183681 (hereinafter referred to as Patent Document 1).

SUMMARY OF THE INVENTION

The technique described in Patent Document 1 allows for easier prediction of the voltage variation in the virtual power lines of the MTCMOS cells, providing effective means to optimally design the margin.

The logic circuit block incorporating the MTCMOS technology is connected to other circuit blocks not incorporating the MTCMOS technology via the power lines (Vdd and Vss lines). Therefore, providing a switching transistor for each logic circuit alone is not sufficient to eliminate the impact of the potentials of the virtual power lines of the MTCMOS cells on other circuit blocks.

Figure 1A:
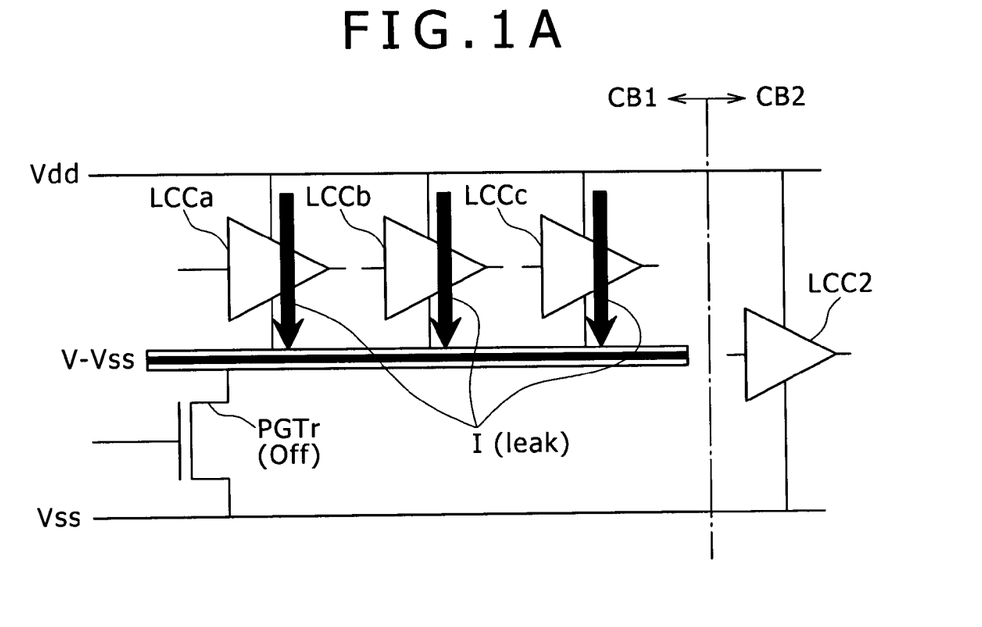
FIGS. 1A and 1B are schematic circuit diagrams for describing a potential interference between two circuit blocks, one incorporating and the other not incorporating the MTCMOS technology, via a Vss line.
Figure 1B:
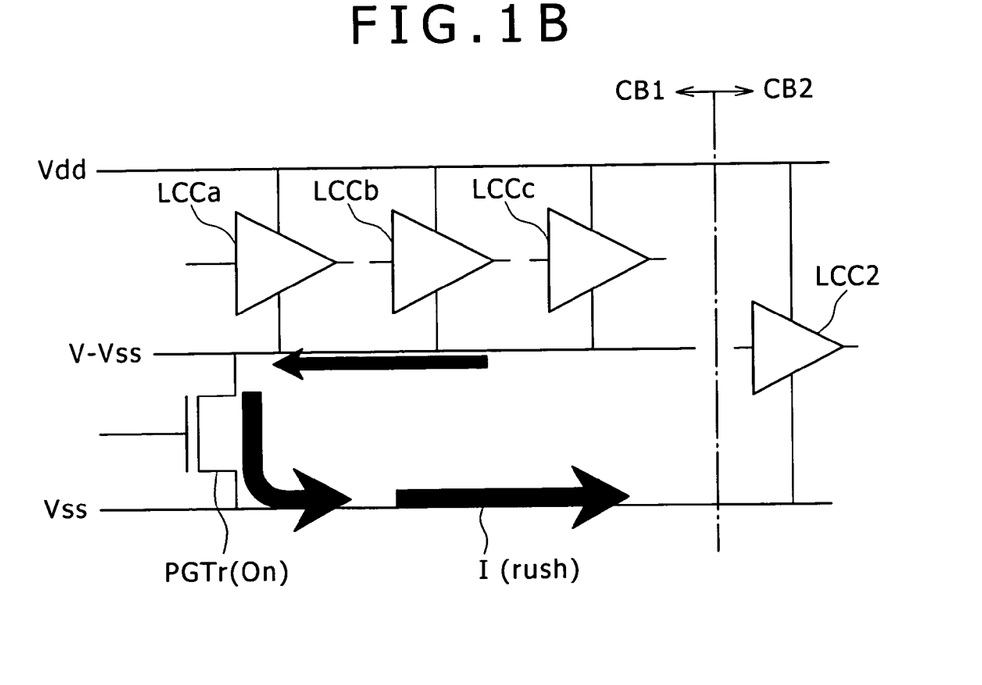

FIGS. 1A and 1B illustrate, by schematic circuit diagrams, the connection relationship between a circuit block incorporating the MTCMOS technology in which a switching transistor is provided between the V-Vss and Vss lines (hereinafter referred to as the "first circuit block") and another circuit block not incorporating the MTCMOS technology (hereinafter referred to as the "second circuit block").

The circuit diagrams in FIGS. 1A and 1B illustrate the first circuit block CB1 incorporating the MTCMOS technology. The first circuit block CB1 is not always on (not always powered) even while the system using the semiconductor integrated circuit is running. Instead, the same block CB1 is off and not active when not used. The same block includes logic circuit cells LCCa, LCCb, and LCCc. The logic circuit cells LCCa, LCCb, and LCCc are connected between the V-Vss and Vdd lines. The V-Vss line is provided only in the first circuit block CB1. A power gate transistor PGTr (switching transistor) is provided between the V-Vss and Vss lines to control the connection and disconnection between the V-Vss and Vss lines. The same transistor PGTr is controlled by a control section such as CPU which is not shown. To interrupt a leak current, the same transistor PGTr has a higher threshold voltage than the logic transistors making up the logic circuit cells LCCa, LCCb, and LCCc.

In contrast, the second circuit block CB2 (and the control circuit) must be always on (be always powered) at least while the system is running. In the same block CB2, therefore, a logic circuit cell LCC2 making up the second circuit block CB2 is provided between the Vdd and Vss lines without the medium of the power gate transistor PGTr. More specifically, the V-Vss line is not provided in the second circuit block CB2. The logic circuit cell LCC2 is directly connected to the Vss line.

The Vdd and Vss lines are connected to power pads (not shown) provided in the semiconductor integrated circuit. These lines are powered, for example, from the system power source provided on the mounting substrate during mounting. At this time, the Vdd line is connected to the source voltage Vdd, and the Vss line maintained at a reference voltage Vss (e.g., GND potential).

FIGS. 1A and 1B also illustrate the current flow respectively when the first circuit block CB1 is inactive and reactivated.

When the same block CB1 is not active, a leak current I (leak) flows through the logic circuit cells LCCa, LCCb, and LCCc. If the same block CB1 remains inactive for a long period of time, the potential of the V-Vss line may rise close to the source voltage Vdd because the power gate transistor PGTr is off. It should be noted that if a power gate transistor having a high threshold voltage is provided also between the logic circuit cells LCCa, LCCb, and LCCc and the Vdd line, it is not completely unlikely, although an order of magnitude less likely as compared to when no such transistor is provided, that a leak current will flow through the logic circuit cells. Therefore, it is not completely unlikely that the potential of the V-Vss line will rise close to the source voltage Vdd.

If the first circuit block CB1 is reactivated in this condition, the power gate transistor PGTr turns on as illustrated in FIG. 1B. This causes the charge accumulated in the V-Vss line to be discharged via the power gate transistor PGTr, resulting in a rush current flowing into the Vss line. This current will be hereinafter written as or called a rush current I (rush).

In the power gate design to apply the MTCMOS technology, it is essential to design the power gate transistor so that the rush current I (rush), which will flow when the power gate block (first circuit block CB1) is reactivated, will not adversely affect other peripheral circuits. In the example shown in FIG. 1B, for example, it is necessary to prevent malfunction of the logic circuit cell LCC2 of the second circuit block CB2 closest to the first circuit block CB1 due to variation of the reference voltage.

In a survey, the applicant of the present embodiment could not find any technology related to elimination of the impact of the variation of the low-level source voltage, caused by the reactivation of the circuit incorporating the MTCMOS technology, on peripheral circuits not incorporating the MTCMOS technology.

In general, however, it is probably possible to control the peak level of the rush current I (rush) to a level not adversely affecting the operation of the peripheral circuits not incorporating the MTCMOS technology by taking enough time to turn on the power gate transistor PGTr.

Figure 2A:
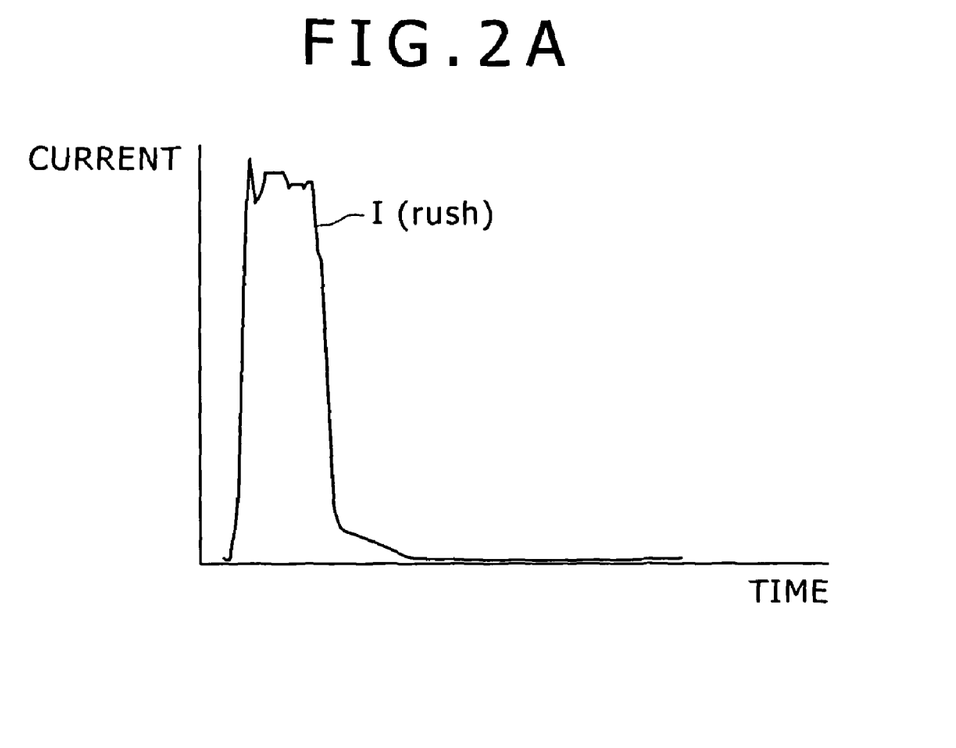
FIGS. 2A and 2B are graphs comparing the change of a rush current over time between when a power gate transistor is turned on instantaneously and when the same transistor is turned on slowly in a controlled manner.
Figure 2B:
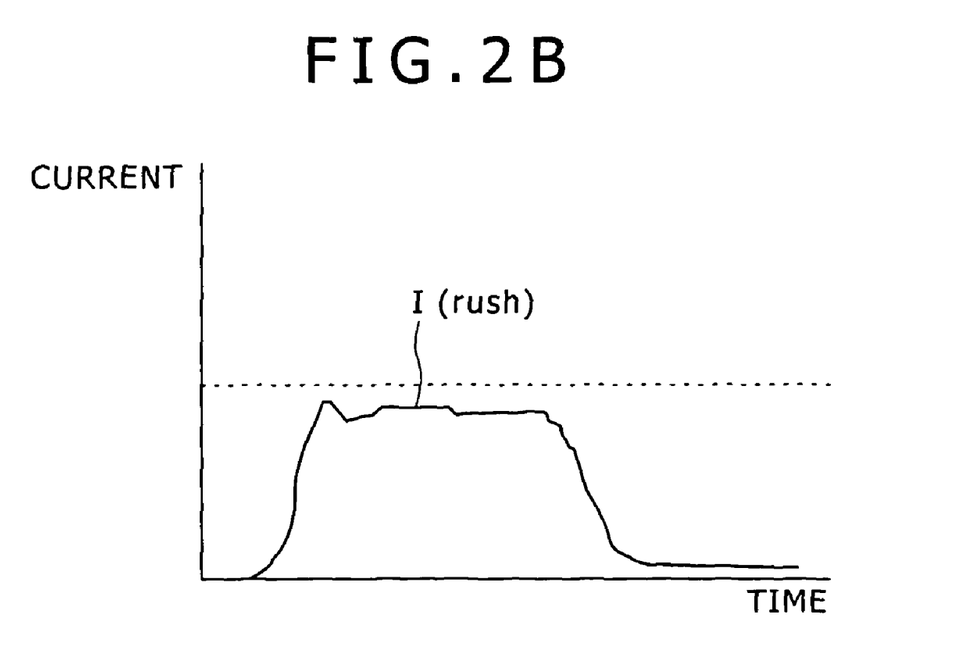

FIG. 2A is a graph schematically illustrating the change of the rush current I (rush) over time when the power gate transistor PGTr is turned on instantaneously. FIG. 2B is a graph schematically illustrating the change of the rush current I (rush) over time when the power gate transistor PGTr is turned on slowly.

Controlling the on-time of the power gate transistor PGTr makes it possible to bring the high peak level of the rush current I (rush) in FIG. 2A below the target level represented by the dashed line as shown in FIG. 2B.

However, turning on the power gate transistor PGTr slowly takes more time. Therefore, this control technique is not applicable to a circuit which must be quickly reactivated.

The semiconductor integrated circuit according to the present embodiment has first and second circuit blocks, a power line switch section and a control circuit adapted to control the power line switch section on the same semiconductor substrate.

The first circuit block incorporates, for example, the so-called MTCMOS technology to ensure reduced power consumption during an inactive period. More specifically, the first circuit block includes a switching transistor (power gate transistor) which is off when the circuit block is inactive and on when the circuit block is active. Internal circuits thereof adapted to provide predetermined functions (e.g., logic circuit cells) are connected to a first power line which is maintained at a low-level source voltage.

The second circuit block does not incorporate the MTCMOS technology, for example, because it must be on at all times. More specifically, the internal circuits adapted to provide predetermined functions are connected directly to a second power line which is maintained at a low-level source voltage.

The power line switch section is connected between the first and second power lines.

The control circuit controls the power line switch section so that the first and second power lines are connected together at a later timing or gradually over a longer period of time than the switching transistor turns on.

According to the semiconductor integrated circuit configured as described above, the switching transistor is off when the first circuit block is inactive. Therefore, the nodes and internal wirings (e.g., virtual power lines) to be maintained at the low-level source voltage in the internal circuits may rise close to a high-level source voltage, for example, due to an off-leak current of the internal circuits. When the first circuit block is activated next time and the switching transistor turns on, the charge accumulated in the nodes and internal wirings as a result of a potential rise will be instantaneously discharged to the first power line via the switching transistor which is on. This causes the potential of the first power line to rise instantaneously. If a low-impedance discharge path is provided on the first power line, the potential will rise only momentarily and the peak potential level will not rise significantly. However, if a sufficient discharge path is not provided, the peak potential level will be high and the potential drop will be relatively slow. Irrespective of whether a sufficient discharge path is provided, a potential peak develops in the first power line.

In the present embodiment, the power line switch section is disposed between the first power line where a potential peak develops and the second power line on the side of the second circuit block. Further, the control circuit controls the power line switch section so that the same section turns on at a later timing or gradually over a longer period of time than the switching transistor turns on.

If the power line switch section is caused to turn on later than the switching transistor, the first power line is connected to the second power line after the potential of the first power line has lowered sufficiently rather than when the potential is at its peak.

On the other hand, if the time required for the power line switch section to turn on is extended more than the time required for the switching transistor to turn on, the connection impedance of the power line switch section (impedance between the first and second power lines at the time of connection) will gradually drop. Therefore, the potential peak of the first power line is transferred to the second power line, for example, via the power line switch section whose connection impedance is relatively high, thus attenuating the peak level.

Hence, the peak potential level of the first power line is either not transferred at all to the second power line or transferred thereto after having been attenuated. As a result, the potential peak will not adversely affect the operation of the second circuit block.

It should be noted that the first circuit block is activated quickly when the switching transistor turns on. The reason for this is that the internal circuits of the first circuit block become operational when the same block is activated.

The operation method of the semiconductor integrated circuit according to the present embodiment is an operation method of a semiconductor integrated circuit which includes first and second circuit blocks. The first circuit block can control the connection of a first power line, maintained at a low-level source voltage, to its internal circuits by a switching transistor. The switching transistor is off when the circuit block is inactive and on when the circuit block is active. The second circuit block has its internal circuits connected directly to a second power line which is maintained at a low-level source voltage. When the first circuit block is activated, the first and second power lines are connected together at a later timing or gradually over a longer period of time than the switching transistor turns on.

DETAILED DESCRIPTION OF THE PREFERRED EMBODIMENTS

The present embodiments provide advantages in that the variation in low-level source voltage caused by the activation of a circuit incorporating the MTCMOS technology does not adversely affect peripheral circuits not incorporating the MTCMOS technology and that the circuit incorporating the MTCMOS technology can be activated quickly.

The preferred embodiments of the present embodiment will be described below taking as an example a semiconductor integrated circuit (IC) device which contains circuit blocks, some incorporating and others not incorporating the MTCMOS technology, with reference to the accompanying drawings.

First Embodiment

Figure 3:
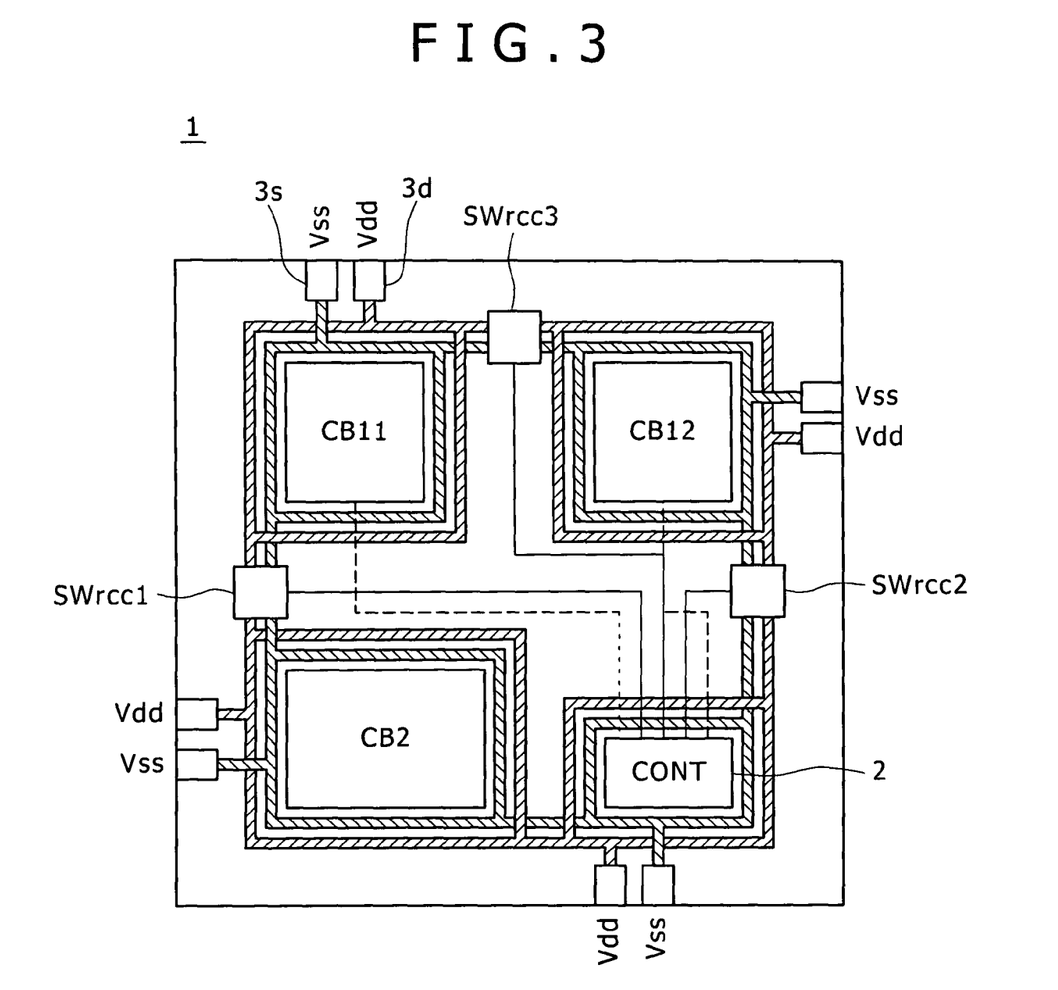
FIG. 3 is a block configuration diagram of a semiconductor integrated circuit according to an embodiment of the present embodiment.

FIG. 3 is a block configuration diagram of a semiconductor integrated circuit according to an embodiment of the present embodiment.

A semiconductor integrated circuit 1 diagrammatically illustrated in FIG. 3 has a plurality of circuit blocks (four blocks in this case) arranged on the same semiconductor substrate.

More specifically, four blocks, namely, two first circuit blocks CB11 and CB12, a second circuit block CB2 and a control circuit block (CONT) 2, are arranged on the same semiconductor substrate as shown in FIG. 3. The two first circuit blocks CB11 and CB12 incorporate the MTCMOS technology whereas the second circuit block CB2 does not. The control circuit block (CONT) 2 controls the first and second circuit blocks.

Each of the first circuit blocks CB11 and CB12 has an arbitrary number of logic circuit cells LCCa, LCCb, LCCc and so on as with the first circuit block CB1 shown in FIGS. 1A and 1B. Further, each of the first circuit blocks CB11 and CB12 has at least the V-Vss line as a virtual power line. The arbitrary number of logic circuit cells LCCa, LCCb, LCCc, and so on are connected between the V-Vss and Vdd lines. The power gate transistor PGTr is connected between the V-Vss line and the Vss line which serves as a first power line. The number of power gate transistors PGTr is not limited to one per first circuit block. Instead, the plurality of power gate transistors PGTr may be provided for each first circuit block.

The gate voltage of the power gate transistor PGTr is controlled by the control circuit block 2 through the path indicated by a dashed line in FIG. 3. This allows the control circuit block 2 to control the deactivation and reactivation of the first circuit blocks CB11 and CB12 independently of each other.

As illustrated in FIG. 3, power pads 3d and power pads 3s are both provided in plurality in the peripheral portion of the semiconductor integrated circuit 1. The power pads 3d supply the high-level source voltage Vdd. The power pads 3s supply the reference voltage Vss serving as the low-level source voltage. It should be noted that signal I/O pads and other components are also provided in the peripheral portion of the semiconductor integrated circuit 1 in addition to the power pads. However, the components other than the power pads are not shown in FIG. 3.

The power pads 3s adapted to supply the low-level source voltage (reference voltage Vss) are preferably provided for each of the first circuit blocks CB11 and CB12. This is intended to provide a fast discharge path, and a detailed description thereof will be given later.

The power line (Vdd line) connected to the power pads 3d has a wiring pattern which allows supply of the source voltage Vdd to the first circuit blocks CB11 and CB12, second circuit block CB2 and control circuit block 2. The power line (Vss line) connected to the power pads has a wiring pattern which allows supply of the reference voltage Vss thereto.

In the case of the wiring patterns illustrated in FIG. 3, the Vdd and Vss lines are disposed in such a manner as to surround each of the circuit blocks. In this example, the Vss line is disposed in proximity to each of the circuit blocks, and the Vdd line is disposed on the outer side of the Vss line. However, the Vss and Vdd lines may be arranged in reverse to the above.

One power line switch section is provided between the circuit block incorporating the MTCMOS technology (first circuit block CB11 or CB12) and that not incorporating the MTCMOS technology (second circuit block CB2 or control circuit block 2), and one between the circuit blocks incorporating the MTCMOS technology.

More specifically, a power line switch section SWrcc1 is provided between the Vdd and Vss lines disposed around the first circuit block CB11 and those disposed around the second circuit block CB2. Similarly, a power line switch section SWrcc2 is provided between the Vdd and Vss lines disposed around the first circuit block CB12 and those disposed around the control circuit block 2. A power line switch section SWrcc3 is provided between the Vdd and Vss lines disposed around the first circuit block CB11 and those disposed around the first circuit block CB12.

Each of the power line switch sections SWrcc1, SWrcc2, and SWrcc3 includes two sub-sections, one adapted to control the connection between the Vdd lines and the other adapted to control the connection between the Vss lines. Each sub-section may be made up of one or a plurality of P- or N-channel transistors.

If each sub-section is made up of a plurality of transistors, P- and N-channel transistors may be connected in parallel to form a transfer gate. Alternatively, two or more transistors of identical channel type may be connected in parallel to form a plurality of stages.

The power line switch sections SWrcc1, SWrcc2, and SWrcc3 are each connected to the control circuit block 2 as shown in FIG. 3 by the solid lines to control the transistor gate voltage. The control circuit block 2 has a functional section corresponding to a "control circuit." The functional section (control circuit) is capable of controlling the power line switch sections SWrcc1, SWrcc2, and SWrcc3 independently of one another.

Figure 4A:
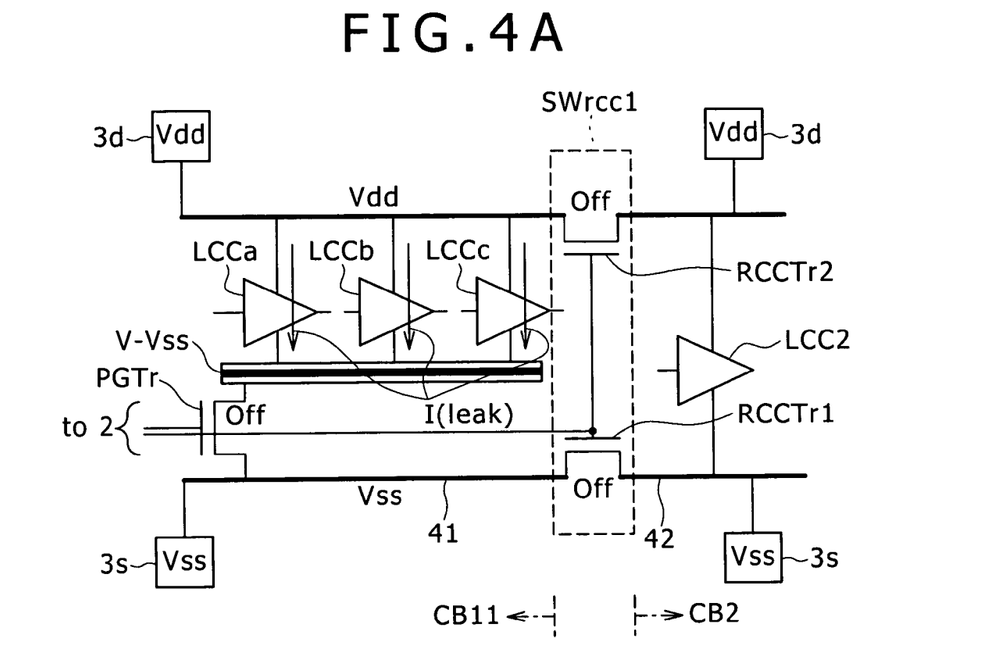
FIGS. 4A and 4B are circuit diagrams similar to those shown in FIGS. 1A and 1B for describing the operation of a first embodiment.
Figure 4B:
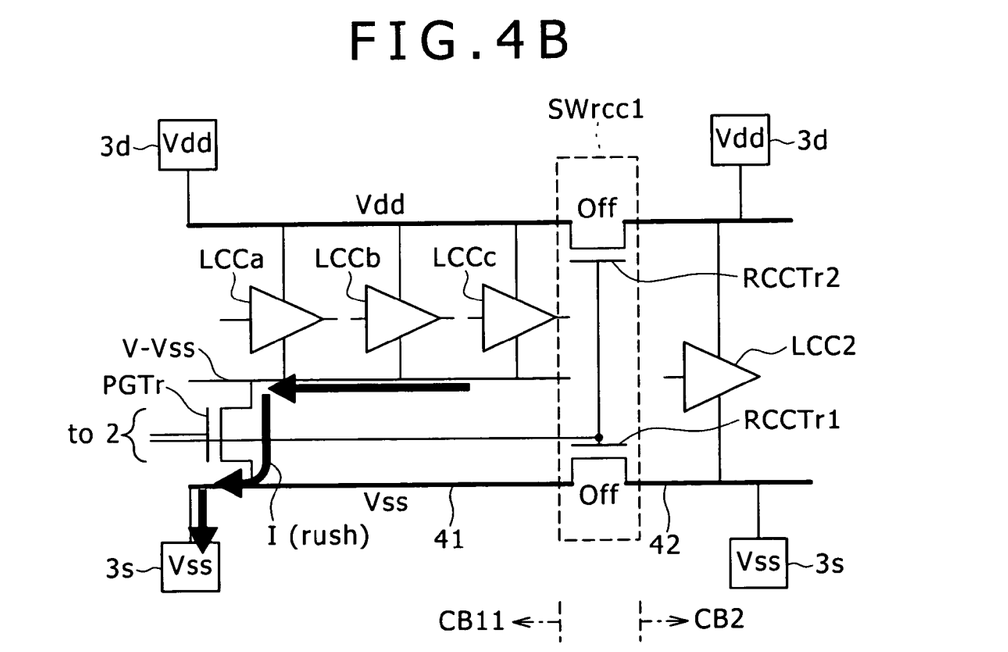

FIGS. 4A and 4B illustrate the first circuit block CB11, second circuit block CB2 and connection portions thereof taking as an example the case in which each sub-section of the power line switch section SWrcc1 includes a single transistor.

FIGS. 4A and 4B are identical to FIGS. 1A and 1B except that the power line switch section SWrcc1 is provided. The same components are denoted by the same reference numerals, and a description of the common configuration will be omitted.

The power line switch section SWrcc1 includes a rush current control transistor RCCTr1 and control transistor RCCTr2. The rush current control transistor RCCTr1 controls the connection between the Vss lines. The control transistor RCCTr2 controls the connection between the Vdd lines.

The rush current control transistor RCCTr1 and control transistor RCCTr2 in the present example are NMOS transistors which have a common gate and which are controlled by the control circuit block 2.

The operation method of the semiconductor integrated circuit 1 (activation method of the MTCMOS circuit block) according to the present embodiment will be described next with reference to FIGS. 4A and 4B and the flowchart in FIG. 5.

Figure 5:
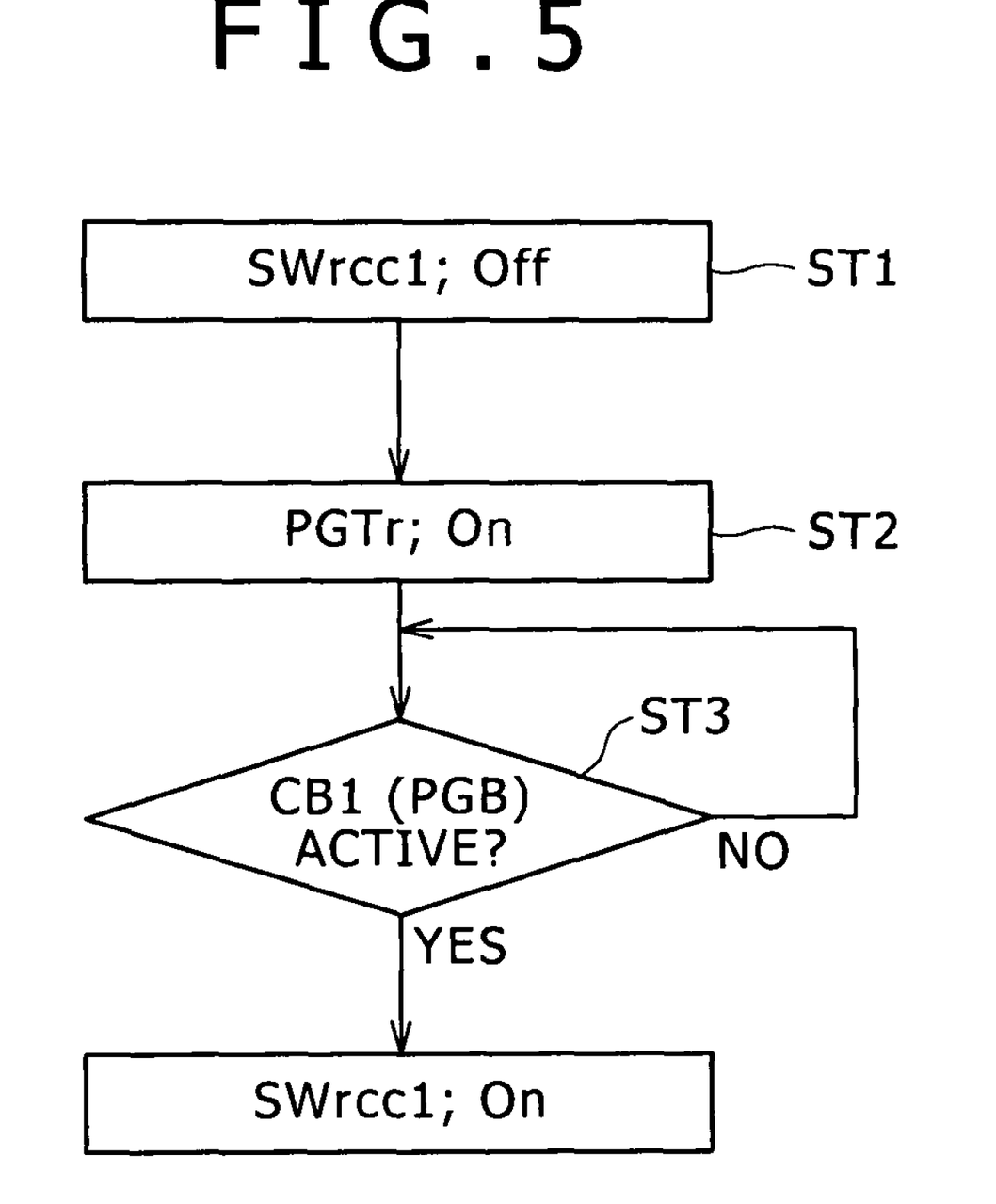
FIG. 5 is a flowchart according to first and second embodiments.

In step ST1 shown in FIG. 5, the first circuit block CB11, namely, the MTCMOS circuit block, is inactive. Therefore, the power gate transistor PGTr is off. At this time, the V-Vss line is disconnected from the Vss line (first power line 41) as illustrated in FIG. 4A. As a result, the leak current I (leak) flows from the Vdd line serving as a power supply source according to the leak characteristics of the logic circuit cells LCCa, LCCb, and LCCc. This causes the potential of the V-Vss line to rise. If the first circuit block CB11 remains inactive for a long period of time, the potential of the V-Vss line may rise close to the source voltage Vdd.

Also in step ST1, the rush current control transistor RCCTr1 and control transistor RCCTr2 are both off (SWrcc1; off). Therefore, the Vss line (second power line 42) on the side of the second circuit block CB2 is electrically disconnected from the Vss line (first power line 41) on the side of the first circuit block CB11.

The first circuit block CB11 is activated, and the power gate transistor PGTr turned on at the instruction of the control circuit block 2 (step ST2). Then, the control circuit block 2 checks to determine whether the first circuit block CB11, namely, the power gate circuit block (PGB), is active (step ST3). When confirming that the first circuit block CB11 is active, the control circuit block 2 turns on the power line switch section SWrcc1 (step ST4).

As described above, in the present embodiment, the control circuit block 2 turns on the power gate transistor PGTr and then a while later turns on the power line switch section SWrcc1. When the power gate transistor PGTr turns on, the charge accumulated in the V-Vss line is discharged as the rush current I (rush) via the power gate transistor PGTr which is on, the first power line 41 (Vss line) and power pad 3s, as illustrated in FIG. 4B.

Figure 6A:
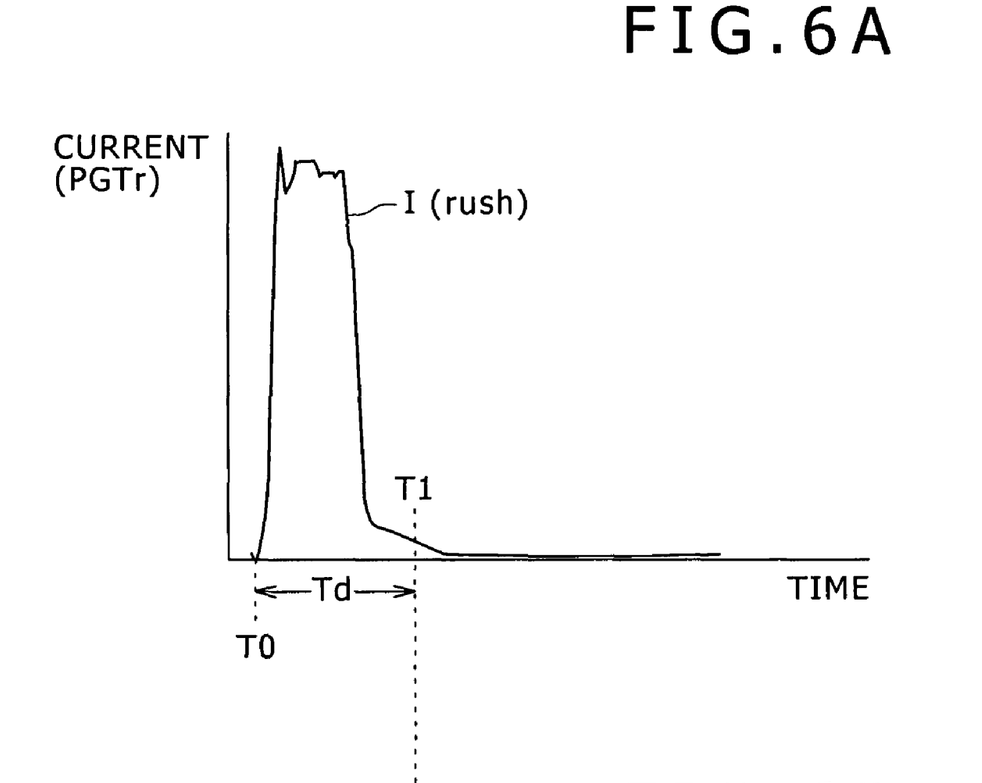
FIG. 6A is a graph illustrating the change of the rush current flowing through the power gate transistor over time.
Figure 6B:
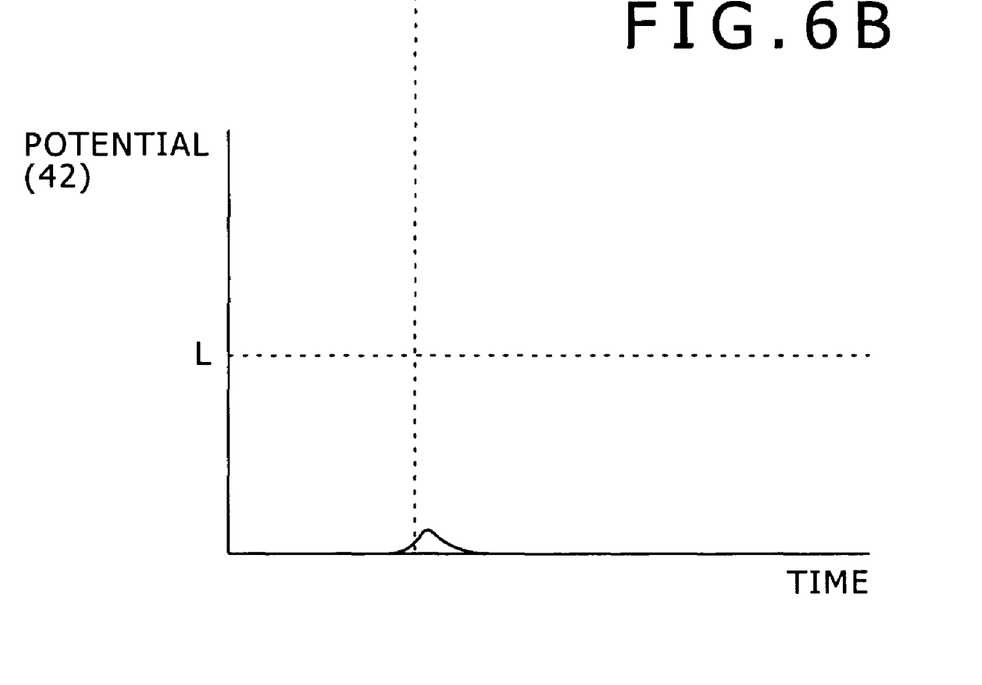
FIG. 6B is a graph illustrating the change of the potential of the second power line over time.

FIG. 6A illustrates the change of the current flowing through the power gate transistor PGTr over time. FIG. 6B illustrates the change of the potential of the second power line 42 over time.

The power line switch section SWrcc1 is set to turn on, for example, at time T1 delayed by a predetermined delay time Td from time T0 when the power gate transistor PGTr turns on, as illustrated in FIG. 6A. Therefore, the first and second power lines 41 and 42 are connected after the rush current I (rush) has been sufficiently discharged. As a result, the rush current I does not cause any variation in the potential of the second power line 42. Even if the potential changes, this change will remain sufficiently smaller than a level L indicated by the dashed line where the operation of the second circuit block CB2 is adversely affected, as illustrated in FIG. 6B.

In terms of the speed at which the first circuit block CB11 is activated, on the other hand, the power gate transistor PGTr is turned on instantaneously in step ST2 shown in FIG. 5. This is the beginning of the activation. Therefore, the first circuit block CB11 is activated quickly.

Figure 7:
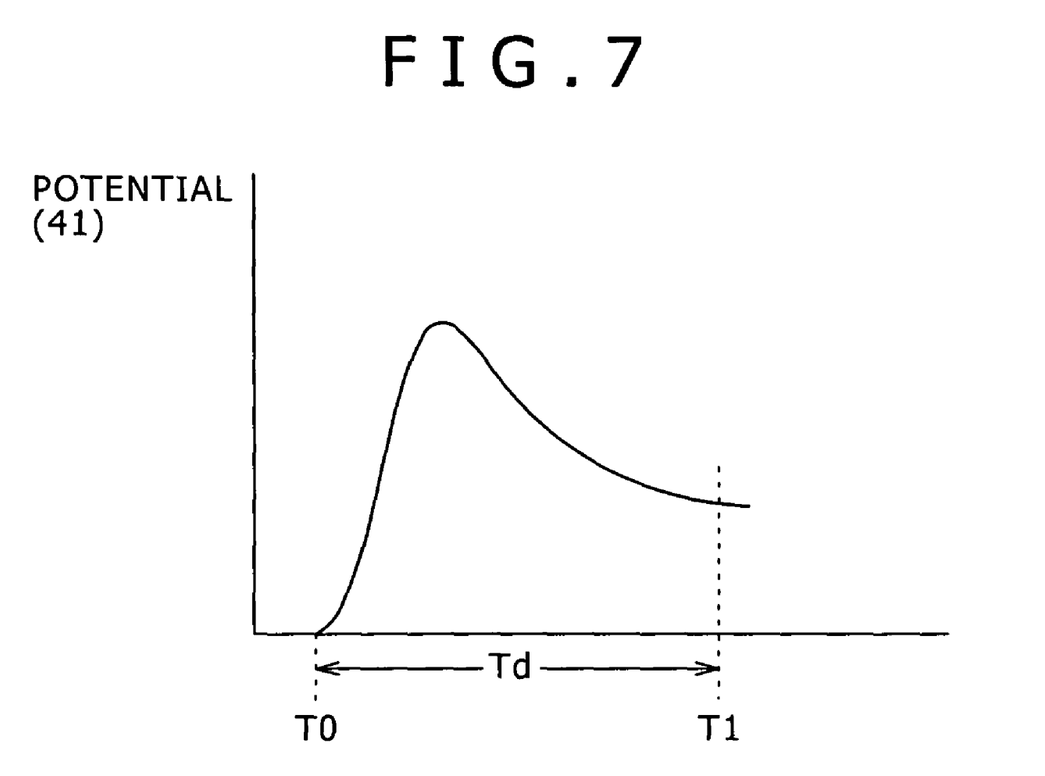
FIG. 7 is a graph illustrating the change of the potential of the first power line over time when a sufficient discharge path is not provided.

It should be noted that if the power pad 3s is not connected to the first power line 41, the rush current I (rush) shown in FIG. 6A will charge the wiring capacitance of the first power line 41. As a result, the potential of the first power line 41 often converges relatively slowly to a given potential after peaking once as illustrated in FIG. 7. In this case, it is only necessary to increase the delay time Td so as to turn on the power line switch section SWrcc1 at time T1 when the potential of the first power line 41 is sufficiently low. This at least ensures that the peak potential of the first power line 41 based on the rush current I (rush) will not be transferred to the second power line 42, effectively preventing malfunction of the second circuit block CB2.

It should be noted that even if the power line switch section SWrcc1 is turned on later as described above, the fact that the activation of the first circuit block CB11 begins when the power gate transistor PGTr is turned on remains unchanged. It should be noted that if a sufficient discharge path is not provided, there may be a slight delay before the potential of the V-Vss line drops. Therefore, the control circuit block 2 may require more time to determine whether the first circuit block CB11 is active in step ST3. Nevertheless, the first circuit block CB11 can be activated sufficiently faster than if the power gate transistor PGTr is opened gradually.

Before the first circuit block CB11 is reactivated, the control circuit block 2 should first turn off the power line switch section SWrcc1 which is on in a steady state and then perform the process shown in FIG. 5 from step ST1.

Further, the above operation and control during reactivation are performed in two other cases. Those cases are when using the power line switch section SWrcc1 to keep the operation of the control circuit block 2 unaffected by the reactivation of the first circuit block CB12 and when reactivating one of the two first circuit blocks CB11 and CB12 provided on the sides of the power line switch section SWrcc3 in such a manner as not to adversely affect the other block.

Second Embodiment

The present embodiment illustrates other examples of the reactivation method and configuration examples of the power line switch sections suitable therefor. Therefore, the configurations, flowchart and descriptions of the first embodiment, namely, the overall configuration in FIG. 3, the configuration of the components other than the power line switch sections in FIGS. 4A and 4B, the flowchart in FIG. 5 and the descriptions thereof, will be applicable.

Figure 8A:
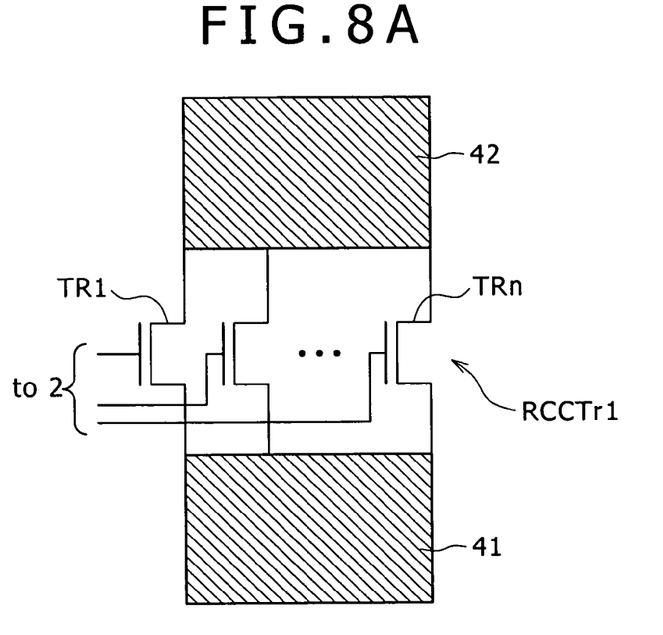
FIG. 8A is a configuration diagram of a rush current control transistor according to the second embodiment.
Figure 8B:
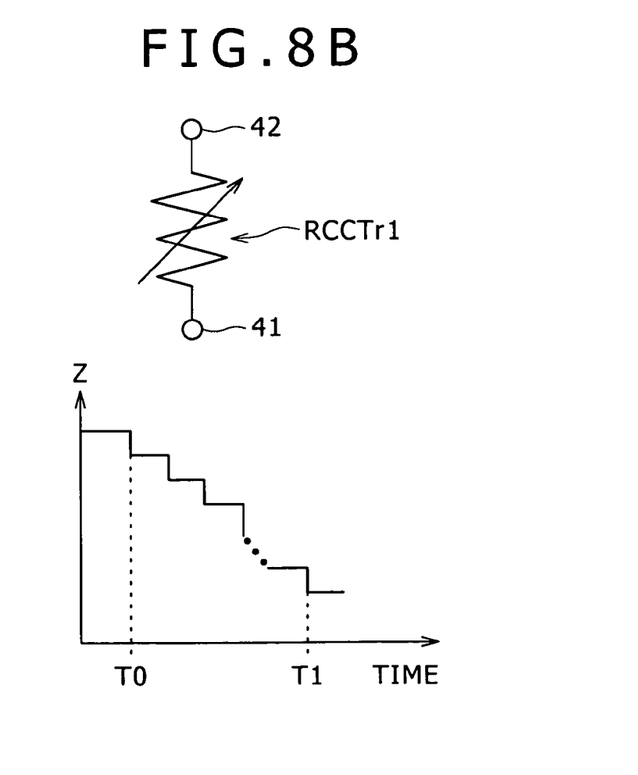
FIG. 8B is an explanatory diagram of the change of impedance.

FIG. 8A illustrates the configuration of part of the power line switch section (rush current control transistor RCCTr1). FIG. 8B schematically illustrates the change of the impedance of the rush current control transistor RCCTr1.

The rush current control transistor RCCTr1 according to the present embodiment (corresponding to Vss line connection portions of the power line switch sections SWrcc1, SWrcc2, and SWrcc3 in FIG. 3) has N pieces (N≧2) of transistors (NMOS transistors TR1 to TRn in this example) connected in parallel between the first power line 41 on the side of the MTCMOS circuit block and the second power line 42 on the side of the circuit block not incorporating the MTCMOS technology, as illustrated in FIG. 8A. The gates of the plurality of NMOS transistors TR1 to TRn can be controlled by the control circuit block 2 independently of one another.

The rush current control transistor RCCTr1 described above can be expressed as a variable resistance element which changes an impedance Z (primarily resistance) between the terminals of the first and second power lines 41 and 42 over time. More particularly, the control circuit block 2 sequentially reduces the impedance Z by reducing the overall on-resistance of the N pieces of NMOS transistors TR1 to TRn in the rush current control transistor RCCTr1. To reduce the overall on-resistance, the control circuit block 2 sequentially increases the number of transistors to be turned on among the NMOS transistors TR1 to TRn.

It should be noted that the NMOS transistors TR1 to TRn may be formed to have different gate widths so that the impedance Z can be changed by the combination thereof. In this case, the impedance can be changed in various manners with a smaller number of transistors as compared to the case in which the transistors have the same gate width. On the other hand, the impedance may begin to change simultaneously with the turning on of the power gate transistor PGTr or slightly thereafter.

Figure 9:
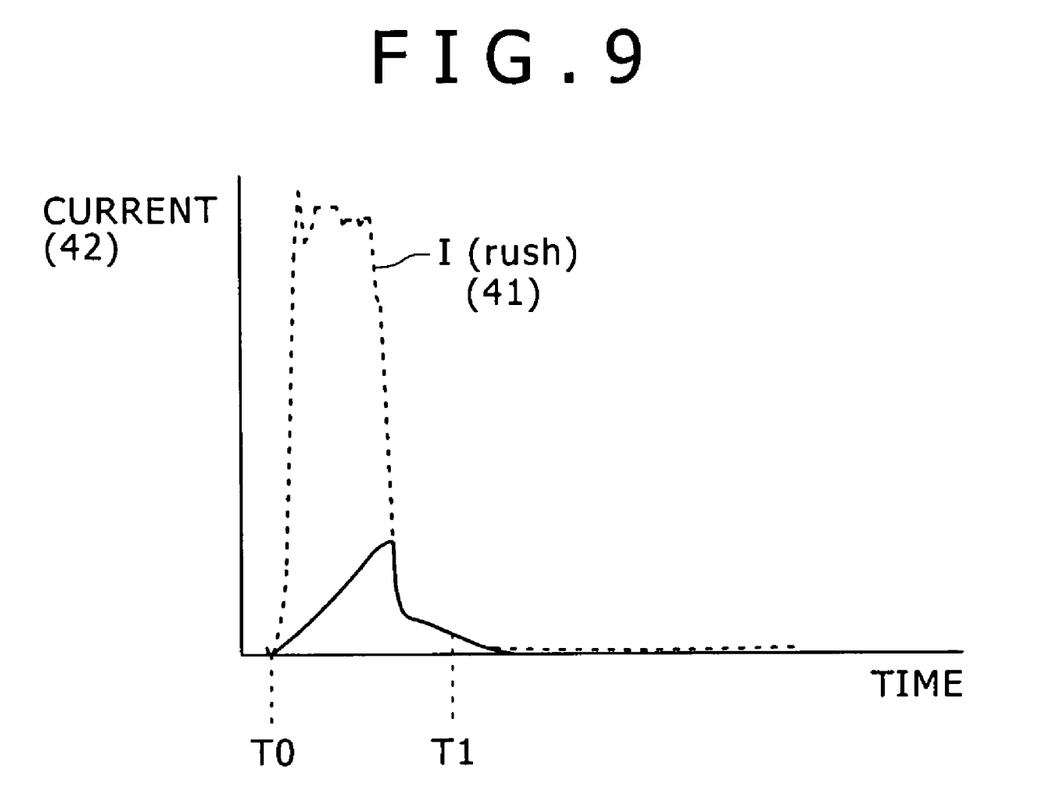
FIG. 9 is a graph illustrating the change of the second power line potential over time which shows the effect achieved by impedance control.

As a result, the peak level of the current flowing into the second power line 42 (solid line) is reduced as compared to that of the rush current I (rush) flowing through the first power line 41 (dashed line), effectively preventing malfunction of the circuit block not incorporating the MTCMOS technology.

According to the first and second embodiments described above, the power line switch sections SWrcc1, SWrcc2, and SWrcc3 are each provided between the necessary circuit blocks in the semiconductor integrated circuit 1. The same sections SWrcc1, SWrcc2, and SWrcc3 each include the rush current control transistor RCCTr1 which is connected between the first and second power lines 41 and 42. This eliminates the need to turn on the power gate transistor PGTr slowly. Further, even if the power gate transistor PGTr is opened instantaneously with a low on-resistance, the impact of the rush current I (rush) will not be transferred to the second power line 42. And even if any impact is transferred, such an impact will be suppressed to a level where the operation of the circuit block not incorporating the MTCMOS technology will not be adversely affected.

Therefore, the present embodiments allow for activation of the circuit blocks incorporating the MTCMOS technology in a short period of time by turning on the power gate transistor PGTr quickly while at the same time preventing malfunction of the circuit block not incorporating the MTCMOS technology due to potential interference via the Vss line.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor integrated circuit on a semiconductor substrate, the semiconductor integrated circuit comprising:
   a first circuit block having first circuit block internal circuits electrically connected to a source voltage line and a virtual reference voltage supply line, said virtual reference voltage supply line being electrically connectable to a reference voltage supply line;
   a second circuit block having second circuit block internal circuits electrically connected to another source voltage line and another reference voltage supply line,
   wherein said source voltage line is connectable to said another source voltage line, said reference voltage supply line being connectable to said another reference voltage supply line,
   wherein a power line switch section connects said source voltage line to said another source voltage line, said reference voltage supply line being connected to said another reference voltage supply line,
   wherein said power line switch section includes a plurality of transistors connected in parallel between said reference voltage supply line and said another reference voltage supply line.

2. The semiconductor integrated circuit of claim 1, wherein a source voltage is supplied to said source voltage line, said source voltage being supplied to said another source voltage line.

3. The semiconductor integrated circuit of claim 2, wherein a reference voltage is supplied to said reference voltage supply line, said reference voltage being supplied to said another reference voltage supply line.

4. The semiconductor integrated circuit of claim 1 wherein said power line switch section is turned off prior to electrically connecting said virtual reference voltage supply line to said reference voltage supply line.

5. The semiconductor integrated circuit of claim 1, wherein said virtual reference voltage supply line is electrically connected to said reference voltage supply line when said first circuit block is active.

6. The semiconductor integrated circuit of claim 5, wherein a switching transistor electrically connects said virtual reference voltage supply line to said reference voltage supply line when said first circuit block is active.

7. The semiconductor integrated circuit of claim 5, wherein said virtual reference voltage supply line is electrically disconnected from said reference voltage supply line when said first circuit block is inactive.

8. An operation method of a semiconductor integrated circuit, the method comprising:
   electrically disconnecting a first circuit block from a second circuit block, and thereafter;
   electrically connecting a virtual reference voltage supply line to a reference voltage supply line, wherein first circuit block internal circuits within said first circuit block are electrically connected to a source voltage line and said virtual reference voltage supply line, wherein second circuit block internal circuits of said second circuit block are electrically connected to another source voltage line and another reference voltage supply line, wherein the step of electrically disconnecting the first circuit block further comprises:

electrically disconnecting said source voltage line from said another source voltage line, and electrically disconnecting said reference voltage supply line from said another reference voltage supply line.

9. The method of claim 8 wherein a source voltage is supplied to said source voltage line and said another source voltage line, a reference voltage being supplied to said reference voltage supply line and said another reference voltage supply line.

10. The method of claim 8 further comprising:

electrically connecting said source voltage line to said another source voltage line, and electrically connecting said reference voltage supply line to said another reference voltage supply line.

11. The method of claim 10, wherein the steps of electrically connecting said source voltage line and electrically connecting said reference voltage supply line are performed before the step of electrically disconnecting the first circuit block.

12. The method of claim 10, wherein the steps of electrically connecting said source voltage line and electrically connecting said reference voltage supply line are performed after the step of electrically connecting the virtual reference voltage supply line.

* * * * *